United States Patent [19]
Hollman et al.

[11] Patent Number: 5,783,835
[45] Date of Patent: Jul. 21, 1998

[54] PROBING WITH BACKSIDE EMISSION MICROSCOPY

[75] Inventors: Kenneth F. Hollman; Hans E. Karlsson, both of Carson City, Nev.

[73] Assignee: Probing Solutions, Incorporated, Carson City, Nev.

[21] Appl. No.: 818,349

[22] Filed: Mar. 17, 1997

[51] Int. Cl.$^6$ ..................................................... G01N 21/86
[52] U.S. Cl. ............................. 250/559.46; 250/559.45; 356/430
[58] Field of Search .................. 250/559.46, 559.45, 250/559.44, 201.3, 309–311; 356/376, 377, 287, 430

[56] References Cited

U.S. PATENT DOCUMENTS

| | | | |
|---|---|---|---|
| 4,755,874 | 7/1988 | Esrig et al. | 358/106 |
| 5,135,303 | 8/1992 | Uto et al. | 250/559.46 |
| 5,266,889 | 11/1993 | Harwood et al. | 324/158 |
| 5,345,170 | 9/1994 | Schwindt et al. | 324/754 |

*Primary Examiner*—Que Le
*Attorney, Agent, or Firm*—Fitch, Even, Tabin & Flannery

[57] ABSTRACT

A method and apparatus for probing with backside emission microscopy for locating defect sites in an integrated circuit specimen, where a first microscope positioned for observing the front side of the specimen and a second microscope positioned for observing the backside of the specimen. A carrier is provided for supporting the specimen in a plane perpendicular to the plane of the first and second microscopes. A white light camera is mounted on the first microscope for acquiring an illuminated image of the front side of the specimen, and generates its image as corresponding to site indicia of the backside of the specimen. A light emission sensitive camera mounted on the second microscope acquires a light emission image of the backside of the specimen in response to electrical test signals applied at terminals of the specimen by test probes. The light emission sensitive camera generates the emission image for superposing with the illuminated image to identify the location of defect sites in the specimen. In a described embodiment, the microscopes are rotatable between vertical and horizontal orientations, wherein the specimen is supported in a vertical plane for backside emission microscopy. Backside supports, e.g., a pair of supports, are positioned at the backside of the specimen leaving an area of interest exposed for observation with said second microscope.

20 Claims, 4 Drawing Sheets

PROBING WITH BACKSIDE EMISSION MICROSCOPY

BACKGROUND OF THE INVENTION

The invention relates in general to emission microscopy, and particularly to methods and apparatus for probing with backside emission microscopy for locating defect sites in an integrated circuit (IC) specimen.

Presently, emission microscopy is used to locate failure modes by observing the photon emissions from failure sites in integrated circuit semiconductor wafers that are stimulated with electrical test signals. Until recently, front side emission microscopy, i.e., observation of the front side of the wafer or packaged part, has been a well used and successful methodology which is fairly easy to integrate into a probing environment. As such many probe stations have been produced by applicants' assignee and other manufacturers that ultimately have been fitted with emission microscopes for this purpose.

The problem with front side emission testing is that often the tell tale light emissions are masked by sub surface metal, dopants and other obscurities. To get at the information required in these types of emission microscopy approaches, a view of the backside of the wafer for emitted photons is advantageous. Some early work has been accomplished in testing packaged parts that are stimulated through lead frames intrinsic to the package that do not necessarily need front side access. However, a major problem with backside emission testing is that one often has to probe the front side of the specimen to stimulate the target site to emit photons.

To test integrated circuit wafers and allow for the probing of packaged parts during backside emission testing presents significant problems for the manufacture of probe stations. The most significant problems being the ability to visualize the front side of the device to be tested for positioning probes and viewing the back side for the resulting emission activity. To further exacerbate the problem, current wafer diameters are presently at 8 inches and moving toward 12 inch diameters, requiring a full range of positional motion for both the specimen and the viewing instrument. Also, for backside testing, typically a significant amount of the backside of the device under test (DUT) wafer material is removed, therefore thinning the structure of the device under test. For packaged parts, this is not very critical, but for wafers of particularly large diameter removal of DUT material can be quite serious, because a wafer may break from the front side force of probes applied during circuit stimulation.

SUMMARY OF THE INVENTION

Typical probing station configurations are horizontal in nature, i.e., the specimen is held on a chuck located horizontally with the optical viewing axis perpendicular to the chuck's plane. Further, platens which facilitate both fixed position probe cards and single manipulators are parallel to the plane of the chuck in the horizontal orientation. Backside emission microscopy under these conditions is possible but very difficult to use requiring significant effort on the part of the user in both setup and usage.

An apparatus and method embodying the present invention simplifies the practice of backside emission microscopy while maintaining techniques generally familiar to the users of emission probe stations. An approach in accordance with a described embodiment is to support the specimen, e.g., a wafer or a packaged device, in the vertical plane and view the specimen from the horizontal plane from both sides. Thus, probing with backside emission microscopy for locating defect sites is illustrated in an embodiment with a first microscope positioned for observing the front side of the specimen and a second microscope positioned for observing the backside of the specimen. A carrier is provided for supporting the specimen in a plane perpendicular to the plane of the first and second microscopes. Backside supports, e.g., a pair of supports, are positioned at the backside of the specimen leaving an area of interest exposed for observation with said second microscope.

A white light camera is mounted on the first microscope for acquiring an illuminated image of the front side of the specimen, and generates its image as corresponding to site indicia of the backside of the specimen. A light emission sensitive camera mounted on the second microscope acquires a light emission image of the backside of the specimen in response to electrical test signals applied at terminals of the specimen by test probes. The light emission sensitive camera generates the emission image for superposing with the illuminated image to identify the location of defect sites in the specimen.

In a described embodiment, the microscopes are rotatable between vertical and horizontal orientations, wherein the specimen is supported in a vertical plane for backside emission microscopy. The probe station with the rotatable microscope arrangement allows for visualizing and probing of wafers and packaged parts in a vertical orientation with a means of supporting the specimen to be tested in the vertical plane. The arrangement thus provides for positioning the microscopes perpendicular to the specimen in a horizontal plane, with microscopes located on either side of the device under test. The probe station arrangement also allows visualizing and probing of wafers and packaged parts in the vertical orientation with a fixed position probe card and holder in the same plane, or alternatively, single positionable probes for use in probing the front side.

The probe station is further outfitted with the provision for axis switching for control purposes so that the operator is not confused by changing coordinate systems. Axis switching allows single apparatus to be used for both front side and backside emission testing while maintaining the facility of probing in both horizontal and vertical cases. Thus, the described apparatus provides the microscopes as being rotatable between their vertical and horizontal orientations for either front side or backside emission microscopy, respectively, wherein the positioning of probes is controlled by manipulators having control axis switching maintaining an x-y coordinate convention for positioning the probes on the specimen in both the horizontal and the vertical orientations of the microscopes.

Briefly summarized, the present invention relates to an emission probe station apparatus and a method for locating defect sites in an integrated circuit specimen having opposing first and second sides, e.g., a semiconductor wafer or a packaged device. A first microscope is provided for observing the front side of the specimen, and a second microscope is provided for observing the backside of the specimen. The specimen is supported in a plane perpendicular to the plane of the first microscope and the second microscope. An illuminated image of the front side of the specimen is acquired, and the illuminated image is generated as corresponding to site indicia of the backside of the specimen. Electrical test signals are applied at terminals on the front side of the specimen, and a light emission image of the backside of the specimen is acquired in response to the test signals applied to the specimen. Identification of the location of defect sites in the specimen can be accomplished by superposing the light emission image with the illuminated image.

3

It is an object of the present invention to provide probing with backside emission microscopy that overcomes the disadvantages and problems of the prior art.

It is another object of the invention to provide an emission probe station apparatus for locating defect sites in an integrated circuit specimen having opposing first and second sides.

It is a further object of the invention to provide a backside emission probe station apparatus for locating defect sites in an integrated circuit specimen.

It is yet another object of the invention to provide a method of locating defect sites in an integrated circuit specimen.

Other objects and advantages of the present invention will become apparent to one of ordinary skill in the art, upon a perusal of the following specification and claims in light of the accompanying drawings.

DETAILED DESCRIPTION OF THE PREFERRED EMBODIMENT

Figure 1:
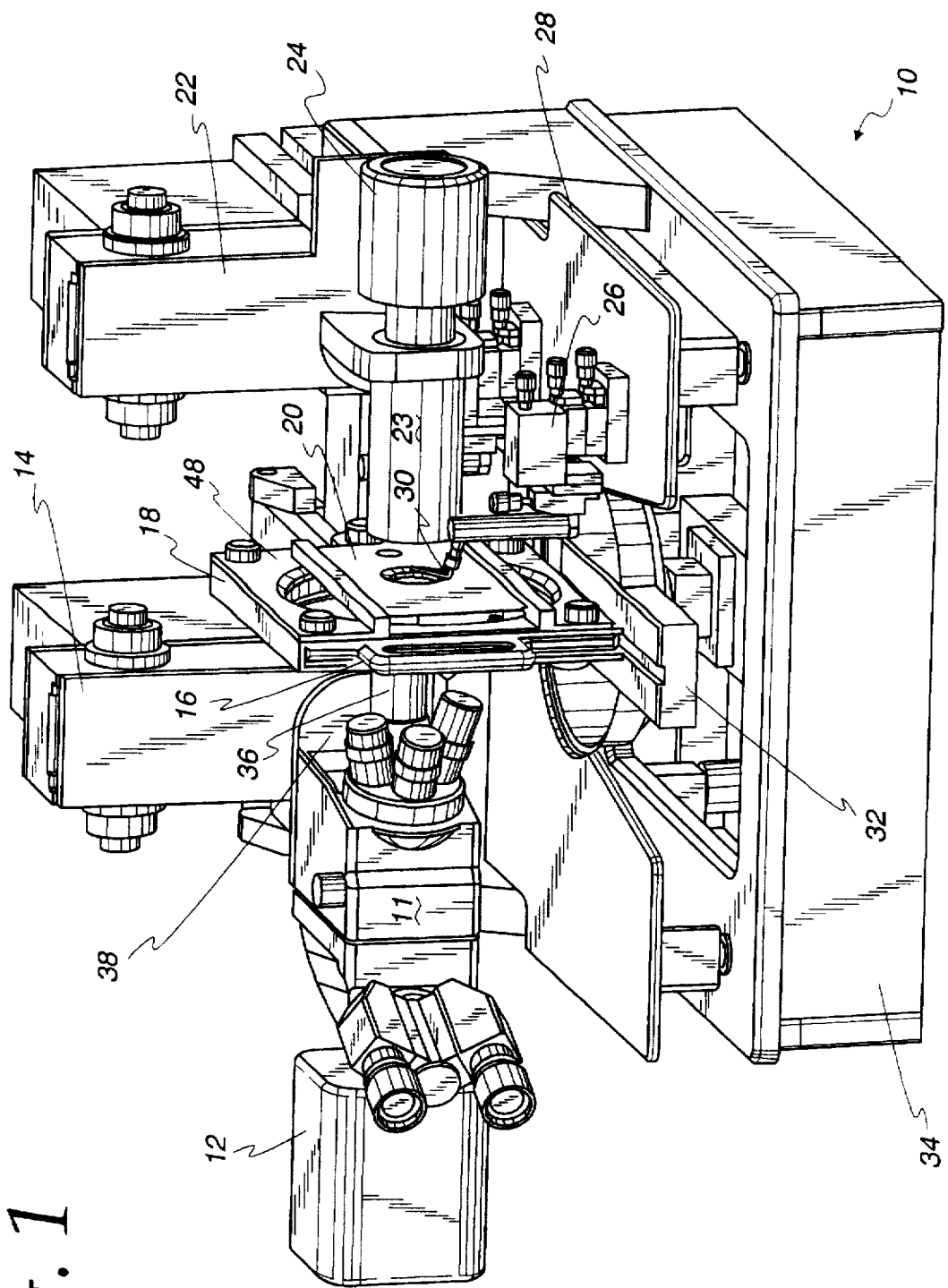
FIG. 1 shows a backside emission probe station embodying the present invention.
Figure 2:
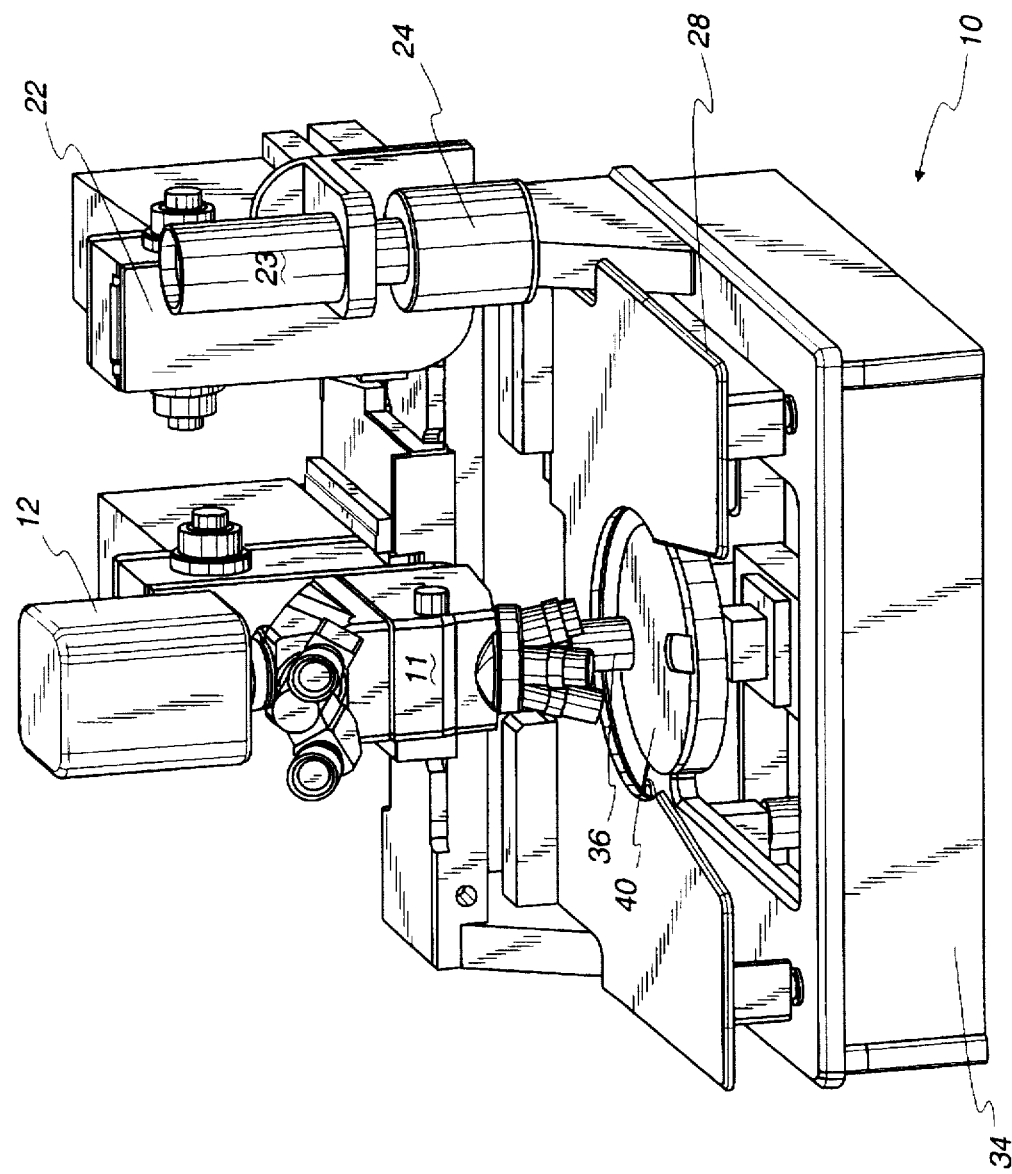
FIG. 2 is the backside emission probe station shown in FIG. 1 rotatably configured for front side emission microscopy.

Referring now the drawings and especially to FIGS. 1 and 2, an apparatus for locating defect sites in an integrated circuit specimen, e.g., a semiconductor wafer, the apparatus providing probing with backside emission microscopy embodying the present invention is generally shown therein and is identified by numeral 10. The typical defect sites located include, but not limited to, dielectric and passivation layer defects, electrostatic discharge damage, hot electron effects, saturated transistors, electromigration voiding and the like. The emission probe station apparatus 10 includes an emission microscope 11 and an emission sensitive camera 12. The microscope 11 is rotatably mounted on a Z-axis support member 14 which positions the microscope 11 for observing a specimen 44 in a DUT carrier 16, wherein the microscope 11 attaches to its support members with a microscope swivel 38 allowing for 90 degree attitude changes as discussed further below. The DUT carrier 16 is supported in a DUT carrier receiver 18. In FIG. 1, a probe station fixed position probe card 20 is shown to the right or backside of the DUT carrier 16 and DUT carrier receiver 18. Another axis support member 22 and its associated microscope swivel rotatably supports a microscope 23 and a white light camera 24 mounted on the microscope 23.

The microscope 23, as shown in FIG. 1, is supported opposite the microscope 11 facilitating the observation of first and second opposing sides of the DUT, i.e., specimen 44. A Micromanipulator with three axis control 26 is supported on a probe station platen 28 for positioning a plurality of probe holders and probes 30 which are moveable with respect to the fixed position probe card 20. The carrier receiver 18 is supported in a DUT carrier mount 32 from the probe station base 34 at the position of a standard wafer chuck of the apparatus 10.

Typical probing station configurations are horizontal in nature, i.e., the specimen is held on a chuck located horizontally with the optical viewing axis perpendicular to the chuck's plane, as is shown and described below in connection with the front side viewing configuration of the apparatus 10 in FIG. 1. The apparatus 10 is usually disposed within an enclosed and controlled environment for isolating the DUT during probing, and often electromagnetic and light interference is eliminated for sensitive applications. Further, platens which facilitate both fixed position probe cards and single manipulators are parallel to the plane of the chuck in the horizontal. Backside emission microscopy under these conditions is possible but difficult due to its use requiring significant effort on the part of the user in both setup and usage. Test stations such as apparatus 10 are used for determining the proper operation of electronic devices, and include probe assemblies e.g. the moveable probe holder and probe 30 for engaging and establishing good electrical contact with predetermined terminals on the specimen 44 for the introduction of electrical test signals. The probes 30 and the microscopes 11 and 23 are each independently adjustable in three dimensions. Adjustment of the probes 30 is provided through the use of the Micromanipulator with three axes of control 26. Such Micromanipulators are presently commercially available, and suitable for this purpose. The described embodiment contemplates modification to the Micromanipulator three axis control 26 to facilitate ease of use with the rotatable apparatus 10, e.g., a pair of manipulators 26 providing control axis switching to maintain an X-Y coordinate convention for positioning probes 30 on the specimen in either horizontal or vertical orientations of the microscopes 11 and 23.

The approach described herein supports the specimen 44, (i.e., wafer or packaged device) in the vertical plane, providing viewing the specimen 44 from the horizontal plane from both sides. In FIG. 1 the front view of the specimen 44 is shown in the described embodiment of the emission microscope 12 mounted on a standard probe station 34 which provides for backside emission capability. This approach uses the two microscopes 11 and 23 for visualizing the specimen 44, the microscope 11 being fitted with the emission sensitive camera 12 and the microscope 23 being fitted with camera 24 herein a typical white light camera for observing the front side of the specimen 44 wherein the specimen 44 is mounted vertically, and perpendicular to the plane of the microscopes 11 and 23. (See FIGS. 1 and 4). As illustrated, the microscope 11 on the left side of the prober is the emission microscope 11 in this embodiment and the microscope 23 on the right is the white light microscope 23. The camera 24 acquires its illuminated image of the front side of the specimen and generates the illuminated image as corresponding to site indicia of the backside of the specimen, because the backside emission testing described herein requires a reversal of one of either the front side or backside images prior to superposing such images. Of course either the front side or the backside image may be reversed for this purpose. Identification of the location of defect sites in the specimen is thus accomplished by superposing the light emission image with the illuminated image. However, in some cases there may be enough circuit indicia visible from the backside for interpretation of defect location information from the backside.

In the described embodiment, the apparatus 10 thus facilitates backside emission microscopy for locating defect sites in an integrated circuit specimen 44, wherein the microscope 23 positioned for observing the front side of the specimen and the microscope 11 is positioned for observing the backside of the specimen 44. A carrier 16 is provided for supporting the specimen 44 in a plane perpendicular to the plane of the microscopes. A white light camera 24 is mounted on the microscope 23 for acquiring an illuminated image of the front side of the specimen 44, and generates its image as corresponding to site indicia of the backside of the specimen. A light emission sensitive camera 12 mounted on the microscope 11 acquires a light emission image of the backside of the specimen 44 in response to electrical test signals applied at terminals of the specimen by the fixed position probe card 20 or test probes 30. The light emission sensitive camera 12 generates the emission image for superposing with the illuminated image to identify the location of defect sites in the specimen 44. Further, the microscopes being rotatable between vertical and horizontal orientations, the specimen 44 is supported in a vertical plane for backside emission microscopy, the microscopes 11 and 23 being aligned along a common horizontal axis passing through the plane in which the vertically orientated specimen 44 is supported.

The probe station apparatus 10 as described above is provided with the pair of microscopes 11 and 23 being of a variety that may be specific to the kind of analysis to be done, e.g., emission microscopy, infrared microscopy, white light microscopy and the like. Of course, the left to right selection of microscope position is arbitrary, and could just as easily be reversed. It should be appreciated that both microscopes 11 and 23 are attached to a horizontal bridge structure with, e.g., rotational element 38 which allows the microscopes that are normally mounted vertically to be rotated 90 degrees to the left and right and therefore taking on a horizontal orientation. The rotational element 38, therefore, allows the probe station to be used in either the more normal horizontal configuration for typical probing requirement and quickly changed to the vertical for backside emission probing.

It should be appreciated that the probe station 10 is outfitted with the provision for automatically switching axis for control purposes so that the operator is not confused by changing coordinate systems, when operating in either horizontal or vertical orientations. The value of this method is that the configuration shown may be used for both front side and backside emission testing while maintaining the facility of probing in both horizontal and vertical cases. For illustration, a pair of manipulators 26 have been positioned just ahead and behind the white light microscope 24 with probes 30 attached to show probing during backside emission testing conditions. Conversely, see FIG. 2 for the typical front side emission and/or typical probing configuration. In the described embodiment, both the emission 12 and light 24 cameras on the microscopes 11 and 23 are rotated 90 degrees to the vertical and the vertically mounted wafer/packaged device carrier (see, FIG. 1; refs. 16, 18) is replaced with a standard horizontally placed wafer chuck 40. Either the emission microscope 12 or the white light microscope 28 may be employed for the result desired. In this front side emission vertical orientation of the microscopes being positioned along side one another, each microscope is positionable over the specimen 44 with the other microscope being positioned along side.

During testing of a particular circuit, it may be desirable to examine different parts of the circuit while maintaining contact between the probes and the test object. Under very high magnification, the field of view of the microscope is relatively small, and horizontal displacement of the microscope relative to the stationary probes may be necessary to enable observation of all of the desired areas of the test object. Accordingly, the probe station apparatus 10 enables precise adjustment of the position of the microscope, in addition to enabling precise adjustment of the position of the stage, enabling precise positioning of individual probes using Micromanipulators 26 having axis control.

To facilitate description of the illustrated probe station 10, rectilinear displacement is referred to in terms of the X, Y and Z axes. Referring to FIGS. 1 and FIG. 2, the forward side of the test station is that on which the eyepieces of the microscope 11 are located, and the terms "left" and "right" are used with reference to a person standing in the user's position, in front of the test station and facing it. The X axis will refer to the left-to-right direction; the Y axis will refer to the forward-to-rear direction; and the Z-axis will refer to the vertical direction.

Figure 3:
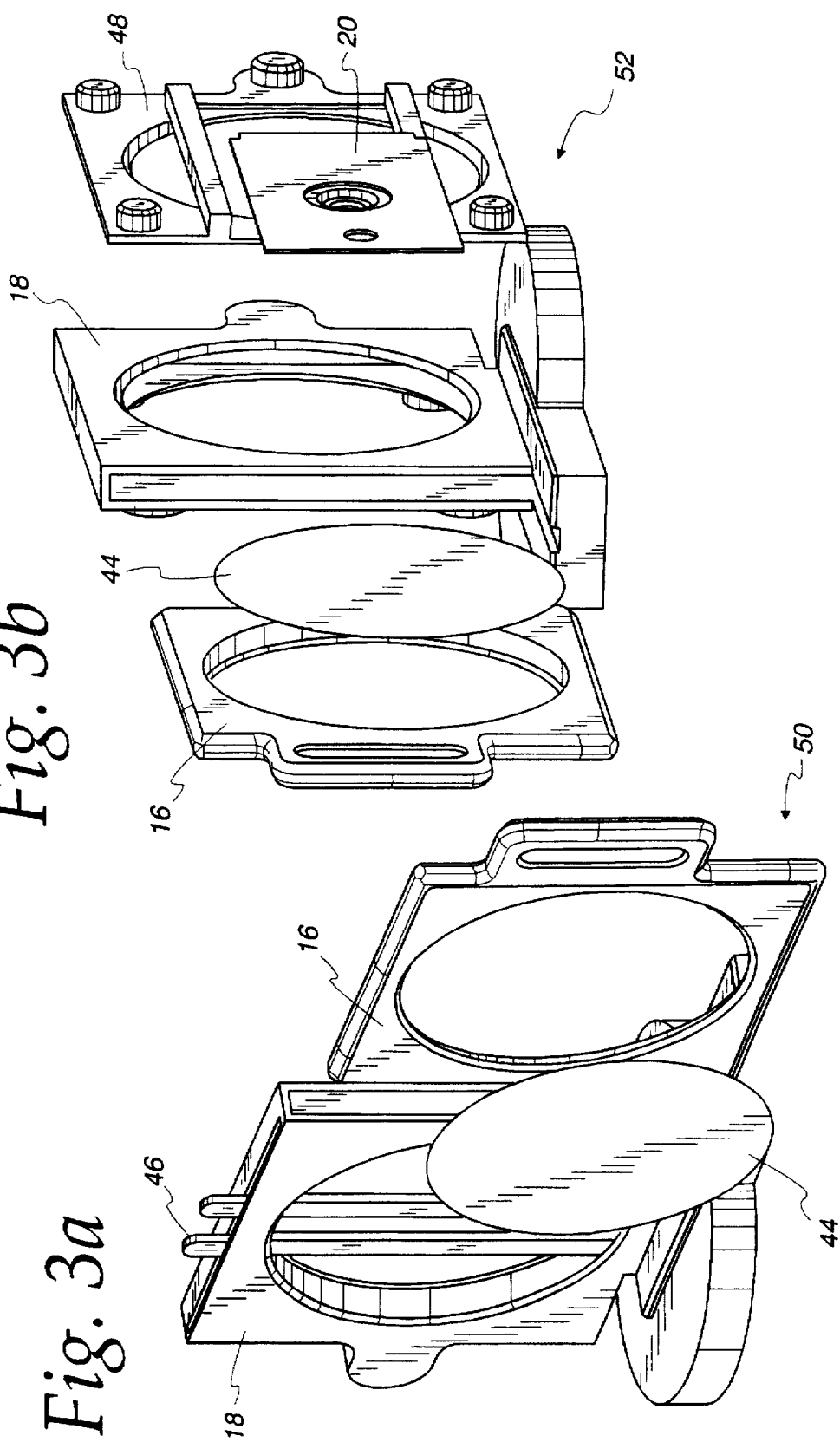
FIGS. 3A and 3B show alternate carrier support embodiments for supporting a DUT specimen in a vertical plane perpendicular to the plane of the microscopes in accordance with the invention.

FIG. 3A shows an embodiment of a carrier support 50 illustrating the vertical wafer/packaged device carrier 16; receiver 18 and mount base 32 is attached to the X, Y stage translation in place of the normal wafer chuck providing a mount for supporting the specimen 44 in the vertical plane. To load/unload the specimen 44, wafer or packaged device, the carrier 16, containing either packaged part or wafer, is inserted into the receiver 18. Vacuum is applied to the carrier 16, in case of wafer testing, once it has been positioned in the receiver 18 to firmly fix the position of the DUT specimen 44. Where the specimen 44 is a semiconductor wafer, vacuum may be applied with an annular vacuum ring or aperture at the carrier 16. For packaged parts, vacuum is not needed as the DUT is inserted into a socket soldered to a PCB such as standard socket cards which are then inserted into the carrier 16 and receiver 18. Additionally, in many probing-emission setups, the addition of a fixed position probe card (see, FIGS. I and 3B; ref. 20) used with and without moveable probes 30 may be used in an alternative embodiment to stimulate the circuit of interest. Thus, FIG. 3B shows an alternative embodiment carrier support 52. The application of the fixed position probe card 20 employs an appropriate holder 48 with adjustments for planarizing and rotational alignment for proper probe alignment to the DUT specimen 44. The PCB mount or the fixed position probe card 20 may also be used for mounting in conjunction with the microscope 23, such that the microscope and the card travel coincidentally.

The probe station 10 with a rotatable microscope arrangement thus allows visualizing and probing of specimen 44, wafers and packaged parts in a vertical orientation, with means of supporting the specimen 44 to be tested in the vertical plane and supporting the specimen 44 from the backside to eliminate the possibility of breakage due to probe forces from the front side. Where it is necessary to remove material or thin the backside of the wafer or packaged device in order to be able to observe the emitted photons, provisions are thus made with respect to the wafer carrier 16 to support the wafer 44 from the backside when probes 30 are applied to the front side. This is provided where possibility of wafer breakage is likely. Where a couple dozen probes or more are in use, at about 2–4 grams per probe, mechanical stress at the specimen 44 may be quite significant, especially when the wafer is thinned from its backside. The wafer carrier receiver 18 thus is provided with a pair of positionable structures 46 that support the wafer specimen 44 from its backside without blocking the area of interest to the emission microscope 11. These supports 46 are adjustable to allow for observation over the entire wafer area without blocking the emission location.

Figure 4:
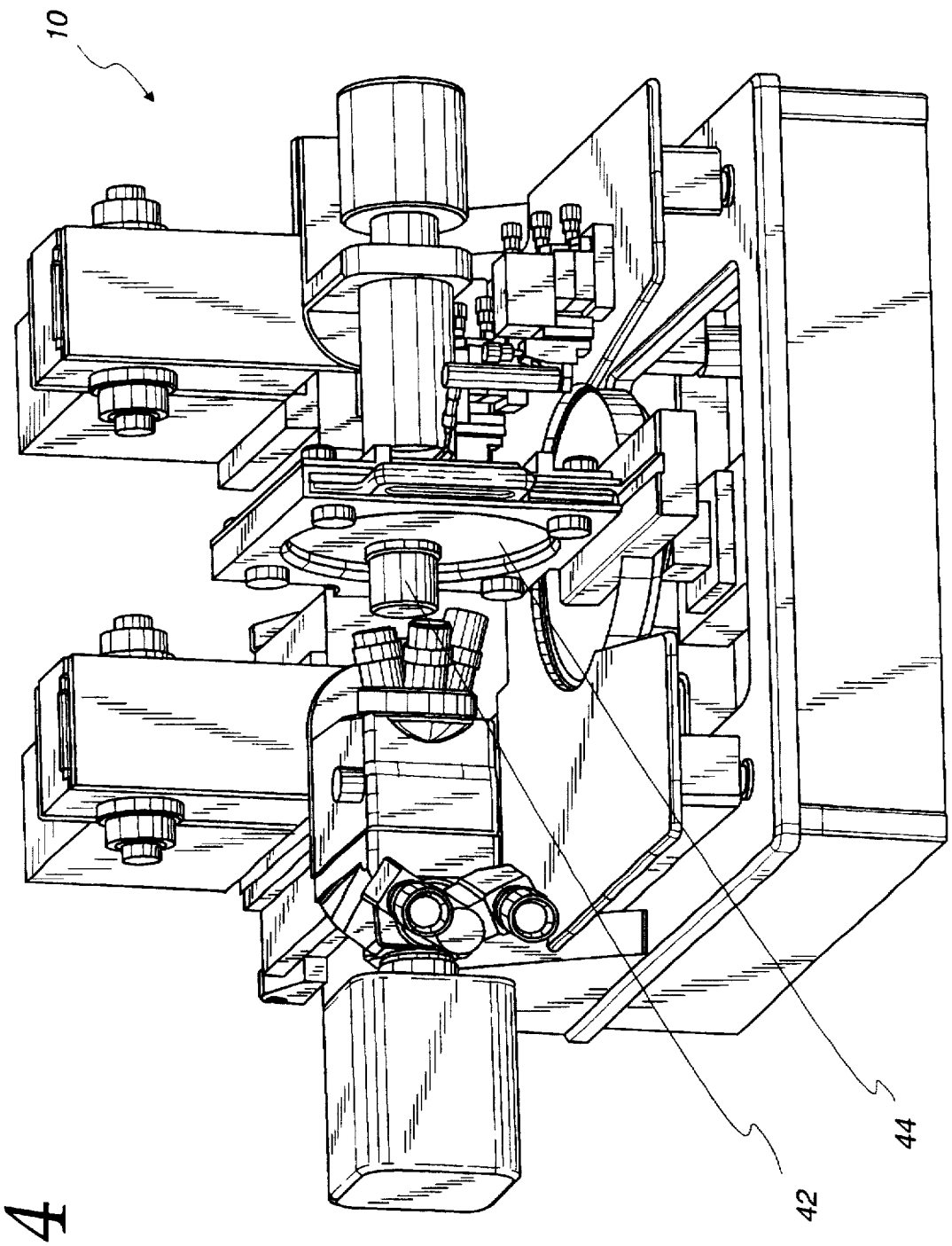
FIG. 4 is a perspective view of the backside emission probe station of FIG. 1 showing a viewing piece for the emission microscope objective.

FIG. 4 is another perspective view of the apparatus 10 of FIG. 1 having an added viewing piece for the emission microscope objective, referred to by numeral 42. The added piece is a seal cup 42 which when pressed to the backside of the wafer constitutes a seal. When this is done, the void created by the seal cup 42 can be flooded with an index liquid, e.g., a liquid emersion having the same index of refraction as the last glass element of the objective or DUT material, whichever gives the best result, the purpose being to increase the optical efficiency of the system by reducing the light losses that occur at each index of refraction interface. The seal cup 42 may also be used to support the backside of the wafer specimen 44.

Emission microscopy is a sensitive technique where increased sensitivity is helpful in locating failure sites, and to this end, the index fluid facilitates pin pointing defects. Thus, the microscope 23 is positioned for observing the backside of the specimen 44 through the fluid, liquid or oil having its index of refraction substantially matching that of the glass layer on the specimen 44 to increase the optical sensitivity in generating the light emission image with the light emission sensitive camera 24 mounted on the microscope 23 for acquiring the light emission image of the backside of the specimen 44 in response to the test signals applied to the specimen by probes 30.

While there has been illustrated and described a preferred embodiment of the present invention, it will be appreciated that modifications may occur to those skilled in the art, and it is intended in the appended claims to cover all those changes and modifications which fall within the true spirit and scope of the present invention.

What is claimed is:

1. An emission probe station apparatus for locating defect sites in an integrated circuit specimen having opposing first and second sides, comprising:

means for positioning a first microscope for observing the first side of the specimen;

means for positioning a second microscope for observing the second side of the specimen;

means for supporting the specimen in a plane perpendicular to the plane of the first microscope and the second microscope;

means for acquiring an illuminated image of the first side of the specimen and generating the illuminated image as corresponding to site indicia of the second side of the specimen;

means for applying electrical test signals to the specimen;

means for acquiring a light emission image of the second side of the specimen in response to the test signals applied to the specimen; and means for superposing the light emission image with the illuminated image to identify the location of defect sites in the specimen.

2. An apparatus as recited in claim 1 wherein said supporting means comprises means for supporting the specimen in a vertical plane.

3. A backside emission probe station apparatus for locating defect sites in an integrated circuit specimen, comprising:

a first microscope positioned for observing the front side of the specimen;

a second microscope positioned for observing the backside of the specimen;

a carrier for supporting the specimen in a plane perpendicular to the plane of said first microscope and said second microscope;

a white light camera mounted on said first microscope for acquiring an illuminated image of the front side of the specimen, said white light camera generating the illuminated image as corresponding to site indicia of the backside of the specimen;

a plurality of probes for applying electrical test signals to terminals on the specimen; and a light emission sensitive camera mounted on said second microscope for acquiring a light emission image of the backside of the specimen in response to the test signals applied to the specimen by said probes, said light emission sensitive camera generating the light emission image for superposing with said illuminated image for identifying the location of defect sites in the specimen.

4. An apparatus as recited in claim 3, wherein said specimen comprises an integrated circuit wafer and said carrier comprises a vacuum source for supporting the specimen in a vertical plane.

5. An apparatus as recited in claim 3, further comprising backside supports for supporting the specimen from its backside behind said carrier.

6. An apparatus as recited in claim 5, wherein said backside supports comprise a pair of supports adjustably positioned from the backside of the specimen for supporting the specimen leaving an area of interest exposed for observation of the backside of the specimen with said second microscope.

7. An apparatus as recited in claim 3, wherein said specimen comprises a packaged integrated circuit device and said carrier receives a printed circuit board having the device supported in a socket on the printed circuit board.

8. An apparatus as recited in claim 3, wherein said plurality of probes comprises a fixed position probe card for applying electrical test signals to the specimen.

9. An apparatus as recited in claim 8, wherein said fixed position probe card is positioned adjacent said carrier in a common plane.

10. An apparatus as recited in claim 3, wherein said plurality of probes applies the electrical test signals at terminals on the front side of the specimen.

11. An apparatus as recited in claim 10, wherein said first microscope and said second microscope are positionable in a vertical orientation, said carrier including an integrated circuit wafer chuck for supporting the specimen in a horizontal plane perpendicular to said first microscope and said second microscope facilitating front side emission microscopy for locating defect sites on the front side specimen, said first and second microscopes being further positionable in a horizontal orientation with the carrier comprising said chuck and a mount for supporting the specimen in a vertical plane between said first and second microscopes.

12. An apparatus as recited in claim 11, wherein said first microscope is positionable over said specimen in said vertical orientation, said second microscope being positioned along side said first microscope, and wherein said second microscope is further positionable over said specimen with said first microscope being positioned along side said second microscope in said vertical orientation.

13. An apparatus as recited in claim 11, wherein said first and second microscopes are rotatable between said vertical orientation for front side emission microscopy and said horizontal orientation for backside emission microscopy, the positioning of said plurality of probes being controlled by at least one pair of manipulators, said pair of manipulators providing control axis switching to maintain an X-Y coordinate convention for positioning said probes on the specimen in said horizontal and said vertical orientations of said first and second microscopes.

14. An apparatus as recited in claim 11, wherein said first microscope opposes said second microscope in said horizontal orientation, said microscopes being aligned along a common horizontal axis passing through the vertical plane in which the specimen is supported.

15. An apparatus as recited in claim 3, wherein said light emission sensitive camera mounted on said second microscope acquires an infrared light emission image of the backside of the specimen in response to the test signals generating the emission image for infrared microscopy of the specimen.

16. An apparatus as recited in claim 3, wherein said second microscope is positioned for observing the backside of the specimen through a fluid having an index of refraction substantially matching that of a glass layer on the specimen to increase the optical sensitivity in generating the light emission image with said light emission sensitive camera mounted on said second microscope for acquiring the light emission image of the backside of the specimen in response to the test signals applied to the specimen by said probes.

17. An apparatus as recited in claim 16, further comprising a seal cup positioned between said second microscope and the specimen for flooding a local viewing area with said fluid for observing the backside of the specimen therethrough.

18. A method of locating defect sites in an integrated circuit specimen, comprising the steps of:

positioning a first microscope for observing the front side of the specimen;

positioning a second microscope for observing the backside of the specimen;

supporting the specimen in a plane perpendicular to the plane of the first microscope and the second microscope;

acquiring an illuminated image of the front side of the specimen and generating the illuminated image as corresponding to site indicia of the backside of the specimen;

applying electrical test signals at terminals on the front side of the specimen;

acquiring a light emission image of the backside of the specimen in response to the test signals applied to the specimen; and superposing the light emission image with the illuminated image to identify the location of defect sites in the specimen.

19. A method as recited in claim 18, wherein the specimen is an integrated circuit wafer, the method further comprising the step of thinning backside of the wafer.

20. A method as recited in claim 18, wherein said supporting step comprises the step of providing backside supports for the specimen.

* * * * *